United States Patent [19]

Adam et al.

[11] Patent Number: 4,806,497

[45] Date of Patent: Feb. 21, 1989

[54] METHOD FOR PRODUCING LARGE-AREA POWER SEMICONDUCTOR COMPONENTS

[75] Inventors: Bruno Adam, Hunzenschwil; André Jaecklin, Ennetbaden; Thomas Vlasak, Birr, all of Switzerland

[73] Assignee: BBC Brown Boveri AG, Baden, Switzerland

[21] Appl. No.: 95,118

[22] Filed: Sep. 11, 1987

[30] Foreign Application Priority Data

Sep. 17, 1986 [CH] Switzerland ................. 3727/86

[51] Int. Cl.$^4$ ............... H01L 21/423; H01L 21/425; H01L 21/428; H01L 29/74

[52] U.S. Cl. ................. 437/006; 437/17; 437/24; 437/142

[58] Field of Search ............... 437/6, 17, 20, 26, 27, 437/28, 29, 45, 142, 24

[56] References Cited

U.S. PATENT DOCUMENTS 4,170,502 10/1979 Watakabe ............... 148/33.5

FOREIGN PATENT DOCUMENTS

| | | |
|---|---|---|
| 0032386 | 7/1981 | European Pat. Off. . |
| 0178582 | 10/1985 | European Pat. Off. . |
| 2603908 | 7/1977 | Fed. Rep. of Germany . |
| 0058349 | 5/1979 | Japan ............... 437/6 |
| 1580490 | 7/1977 | United Kingdom . |
| 2081009 | 2/1982 | United Kingdom ............... 437/17 |

OTHER PUBLICATIONS

Electronics & Power, May 1982, Institution of Electrical Engineers (Hitchin Herts, GB), F. J. Burgum: "The GTO-A New Power Switch", pp. 389-392, see page 389.

ELEKTROTECHNIK, vol. 59, No 23, Dec. 1977, Vogel-Verlag KG, (Wurzburg, DE), K. H. Ginsbach: "Thyristoren in rascher Entwicklung", pp. 24-26, see pp. 24-25.

ELECTRONIQUE ET MICROELETRONIQUE INDUSTRIELLES, vol. 225, Oct. '76 Societe des Editions Radio, (Paris, FR), H. Lilen: "Les nouvelles generations de composants de puissance dependront des technologies de bombardement neutronique et/ou electronique", pp. 22-25.

IEEE Transactions on Electron Devices, vol. Ed. 23, No. 8, Aug. 1976; "Phosphorus Doping of Silicon by Means of Neutron Irradiation", Ernst W. Haas and Manfred S. Schnoller.

"Influence of Carbon Concentration on Gold Diffusion in Silicon", M. J. Hill and P. M. Van Iseghem; Brown, Boveri Research Centre and Semiconductor Development Dept., Switzerland.

Hill et al., IEEE Transactions on Electron Devices, vol. ED-23, No. 8 (Aug. 1976), pp. 809-813.

Platzoder et al., IEEE Transactions on Electron Devices, vol. ED-23, No. 8 (Aug. 1976), pp. 805-808.

*Primary Examiner*—Olik Chaudhuri
*Attorney, Agent, or Firm*—Oblon, Fisher, Spivak, McCelland & Maier

[57] ABSTRACT

A method for producing large-area power semiconductor components, wherein at least two irradiation processes (neutron irridiation, ion implantation electron, $\gamma$ or proton irradiation) are used to produce the basic doping, to introduce deep pn junctions and to introduce recombination centers. It is precisely for the critical process steps (p-base, n-type stop layer) that the improved homogeneity of the layers signifies a higher yield and improved limit data for the finished components.

4 Claims, No Drawings

METHOD FOR PRODUCING LARGE-AREA POWER SEMICONDUCTOR COMPONENTS

BACKGROUND OF THE INVENTION

1. Field of the Invention

The invention relates to the field of semiconductor technology. It relates in particular to a method of producing large-area power semiconductor components which comprises the following steps:

(a) production of a semiconductor substrate with a basic doping;

(b) production of a deep-lying pn junction in the semiconductor substrate by implantation of the semiconductor substrate with foreign atoms and subsequently driving the foreign atoms into the semiconductor substrate; and (c) adjustment of the carrier lifetime by introducing recombination centers into the semiconductor substrate.

2. Discussion of the Background

The basis for producing semiconductor components in general is the systematic introduction of impurities and recombination centers in the form of foreign atoms (in the case of impurities, e.g. Al, As, B, Ga, P; in the case of the recombination centers, e.g. Au or Pt). Especially in the case of semiconductor components intended for high currents and high reverse voltages, pn junctions situated deep in the semiconductor substrate are required. In this case, the introduction of foreign atoms usually splits up into two steps: the implantation of the semiconductor substrate with foreign atoms in the vicinity of the surface and the subsequent drive-in of the foreign atoms into the semiconductor substrate.

Whereas a diffusion process is usually employed for the drive-in, in the state of the art, the implantation usually takes place by means of a gas-phase process and in special cases also by means of a liquid-phase process.

On the other hand, in the production of power semiconductor components irradiation processes are also occasionally used. In this connection, for example, neutron irradiation may be mentioned which results in a phosphorous basic doping via a nuclear transformation in the Si substrate material (so-called neutron transmutation doping). However, ion implantation for the foreign atom implantation or electron, γ or proton irradiation also occasionally find application.

In the case of power semiconductor components with their large substrate areas, maximum utilization of the substrates can only be achieved if properties which are as homogeneous as possible are achieved both inside a single component and also over the entire quantity produced.

Particularly critical are the homogeneity requirements if the target values for the dynamic data of the components are very high, as is the case, for example, in the case of the gate-turnoff thyristor (GTO=Gate Turn Off) which consists of a large number (about 100 to over 1000) of individual thyristors which should all have properties which are as identical as possible.

Conventional (i.e. non-irradiation) methods result in an inhomogeneous distribution of impurity atoms or recombination centers for the following reasons:

doping processes by means of deposition from the liquid or the gaseous phase are supported by flows which result in corresponding inhomogeneities;

certain foreign atoms attach themselves preferably to mostly inhomogeneous defects already present in the crystal (see, for example, M. J. Hill and P. M. Van Iseghem, "Influence of Carbon Concentration on Gold Diffusion in Silicon", Semiconductor Silicon, 1977, pages 715–724).

In the irradiation processes mentioned, these disadvantages do not exist because of the random processes prevailing under these circumstances.

If a single inhomogeneous, traditional process is therefore replaced by an irradiation process (for example, in the case of implantation for doping the p-base of a thyristor deposition from the gas phase by ion implantation), the advantage of greater homogeneity which can in principle thereby be achieved cannot be achieved because inhomogeneities continue to be caused by the other traditional processes.

However, it is precisely the power semiconductor components which are critical from the point of view of production, such as the GTO which rely on as great a homogeneity as possible in the distribution of the impurities and recombination centers. The residual inhomogeneity in these components should be at least less than or equal to 5%, if possible less than or equal to 2%.

SUMMARY OF THE INVENTION

It is therefore the object of the present invention to provide a method with which power semiconductor components having a sufficiently large homogeneity in the distribution of foreign atoms and recombination centers can be produced in order to fulfil even high requirements imposed on the electrical properties.

The object is achieved by a method of the type mentioned in the introduction wherein at least in the case of two of the three steps (a) to (c) an irradiation process is used. The kernel of the invention is therefore no longer to use the conventional inhomogeneous processes taken on their own or in combination with an isolated irradiation process, but to carry out at least two, preferably even all three, steps by means of a substantially homogeneous irradiation process.

As irradiation processes which—each separately—result in homogeneous distributions within the desired spread, the following are preferred:

(1) a neutron irradiation in the form of a neutron transmutation doping which reslts in a homogeneous phosphorous doping of the entire Si substrate via a nuclear reaction for the production of the basic doping. In this process a limitation on the homogeneity results from the distribution of impurities before the irradiation and the intensity distribution of the neutron source.

(2) An ion implantation of, for example, Al, As, B, Ga or P in the form of an implantation in the vicinity of the surface for the implantation of the semiconductor substrate with foreign atoms for the production of a deep-lying pn junction. In this connection a limitation of the homogeneity results from the guidance of the ion beam, which is usually computer-controlled and whose diameter is small in comparison to the diameter of the substrate slice.

(3) An electron, γ or proton irradiation of the semiconductor substrate for the production of recombination centers for adjusting the carrier lifetime. Here, too, the homogeneity limitation is due to the beam guidance.

DESCRIPTION OF THE PREFERRED EMBODIMENTS

As already mentioned, at least two of the irradiation processes listed, preferably, however, all three, are used in the production method according to the invention.

The ion implantation and the electron, $\gamma$ or proton irradiation belong to the common techniques and will not be further explained here.

In relation to neutron irradiation, reference is made for further details, for example, to an article by E. W. Haas and M.S. Schnoller entitled "Phosphorous Doping of Silicon by Means of Neutron Irradiation", IEEE Trans. Electron Devices ED-23 (8), b. 803–805 (1976).

For the production itself it should be stressed that in the case of the thyristor, several implantations are necessary (at least three, and up to six depending on the method). Particularly critical in this connection is—particularly in the case of the GTO—the central p-doped layer of the four-layer arrangement, the so-called p-base. The same applies, in particular in the case of high blocking voltages, for an n-type stop layer embodied in the thyristor. In both cases, both the transverse conductivity (or the sheet resistance) and also the diffusion profile have to be adjusted as precisely as possible.

In the case of the thyristor, however, not only the implantations for the p-base and the n-type stop layer, but all the implantations are carried out by means of ion implantation.

Nevertheless, good results are also obtained if the less critical layers of a thyristor, such as, for example, the anode-emitter, possibly also the cathode-emitter, are produced by conventional processes.

The individual parameters of the irradiation processes naturally depend on the circumstances and requirements pertaining to the production and can incidentally be chosen in a known manner.

To check the advantages which can be achieved with the invention, large GTO thyristors were produced with substrate diameters of up to 50 mm, $V_{DRM} < 2500V$ and $I_{TGQM} < 1000$ A using all three enumerated irradiation processes.

The surface concentration at the p-base was then determined on the substrates by means of an automatic, computer-controlled measuring instrument (with a precision of $\Sigma = 0.16\%$). Conventionally produced substrates were measured in the same manner as a comparison.

While, in the case of the conventionally produced substrates, the local boron concentration varied by $\pm 5$ to 6%, the corresponding variation was $+1$ to 2% in the case of the components produced with irradiation processes.

Comparable homogeneities also resulted in the case of the distribution of the recombination centers in a comparison between the conventional Au diffusion and electron irradiation.

In addition, a higher yield also resulted in the case of the particularly critical processes when the irradiation processes were used.

In total, the combination of several irradiation processes results in markedly improved results in relation to the achievable electrical data and also in the yield in the production of critical power semiconductor components, such as, for example, GTO thyristors.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method for producing a large-area power gate turn-off thyristor, comprising the following steps:
   (a) irradiating a substrate with neutrons to perform neutron transmutation doping and thereby derive a basic doping of said substrate;
   (b) ion-implanting a deep-lying pn junction in the semiconductor substrate by ion implanting dopant atoms in the semiconductor substrate and subsequently driving the dopant atoms into the semiconductor substrate; and
   (c) irradiating the substrate with electron, $\gamma$ or proton irradiation to introduce recombination centers into the semiconductor substrate and thereby adjust the carrier lifetime.

2. The method as claimed in claim 1, comprising: producing a p-base of the thyristor by means of ion implantation.

3. The method as claimed in claim 1, comprising: introducing an n-doped stop layer into the thyristor by means of ion implantation.

4. The method as claimed in claim 1, comprising: forming all doped layers of the thyristor by means of ion implantation.

* * * * *